United States Patent [19]
Oh et al.

[11] Patent Number: 6,013,576
[45] Date of Patent: Jan. 11, 2000

[54] METHODS FOR FORMING AN AMORPHOUS TANTALUM NITRIDE FILM

[75] Inventors: Jae-eung Oh, Seoul; Sang-in Lee; Chang-soo Park, both of Kyungki-do, all of Rep. of Korea

[73] Assignee: Samsung Electronics Co., Ltd., Rep. of Korea

[21] Appl. No.: 08/902,880

[22] Filed: Jul. 30, 1997

[30] Foreign Application Priority Data

Oct. 16, 1996 [KR] Rep. of Korea ............ 96-46342

[51] Int. Cl.[7] .................................................. H01L 21/205
[52] U.S. Cl. ................... 438/648; 438/681; 438/685; 427/576
[58] Field of Search ............................. 438/643, 648, 438/681, 685, 653, 656; 427/576

[56] References Cited

U.S. PATENT DOCUMENTS

| | | | |
|---|---|---|---|
| 5,576,071 | 11/1996 | Sandhu | 427/534 |
| 5,576,579 | 11/1996 | Angello et al. | 257/751 |
| 5,607,722 | 3/1997 | Vaarstra et al. | 427/248.1 |
| 5,668,054 | 9/1997 | Sun et al. | 438/653 |
| 5,677,015 | 10/1997 | Hasegawa | 427/576 |
| 5,817,175 | 10/1998 | Iyer | 117/104 |
| 5,834,068 | 11/1998 | Chern et al. | 427/535 |

*Primary Examiner*—Carl Whitehead, Jr.
*Assistant Examiner*—Kurt Eaton
*Attorney, Agent, or Firm*—Myers, Bigel Sibley & Sajovec, P.A.

[57] ABSTRACT

A metal nitride layer is formed on a substrate by exposing the substrate to a mixture including a nitrogen-containing organometallic gas and a hydrogen plasma to form a metal nitride layer on the substrate. The nitrogen-containing organometallic gas may comprise penta dimethyl amido tantalum $(Ta(N(CH_3)_2)_5$, and the metal nitride layer may be formed by exposing comprises the step of exposing the substrate to a mixture including penta dimethyl amido tantalum gas $(Ta(N(CH_3)_2)_5$ and a hydrogen plasma at a temperature greater than 300° C., more preferably, at a temperature of 300° C. to 750° C. and a pressure of 0.5 torr to 1.5 torr. The penta dimethyl amido tantalum gas $(Ta(N(CH_3)_2)_5$ is preferably provided to a chamber in which the substrate is placed at a mass flow rate of 50 sccm to 150 sccm, and the hydrogen plasma referably provided to the chamber at a mass flow rate of 30 sccm to 100 sccm. The hydrogen plasma may be produced external to the chamber in an atmosphere comprising hydrogen and an inert gas such as argon. A tantalum nitride $(Ta_3N_5$ layer having a resistivity less than $1 \times 10^4$ $\mu\Omega$-cm may thereby be formed.

8 Claims, 9 Drawing Sheets

METHODS FOR FORMING AN AMORPHOUS TANTALUM NITRIDE FILM

FIELD OF THE INVENTION

The present invention relates to microelectronic devices and method of fabrication therefor, in particular, to methods of forming a metal nitride layer and metal nitride layers thereby formed.

BACKGROUND OF THE INVENTION

As the level of integration of a semiconductor device increases, components of the device, e.g., transistors, generally become smaller in size. When the size of a transistor is reduced, the junction depth of impurity regions such as source and drain regions may also be reduced. When a metal wiring pattern is formed on a shallow impurity region and then undergoes subsequent thermal processing, a junction spiking phenomenon may occur in which metal atoms penetrate into the impurity region and the silicon substrate situated thereunder. This junction spiking may cause the semiconductor device to malfunction. To combat this phenomenon, a technique has been developed for preventing metal atoms of metal wiring from diffusing into the impurity region and the silicon substrate has been developed wherein a barrier metal film such as a titanium nitride film or a tantalum nitride film is formed between the metal wiring and the impurity region.

A typical cell capacitor in a unit cell of a semiconductor memory device such as a dynamic random access memory (DRAM) includes a storage electrode, a dielectric film formed on the storage electrode and a plate electrode formed on the dielectric film. As integration density is increased, the area occupied by a unit cell typically decreases, and thus the capacitance of the cell capacitor typically is reduced. The reduction in the cell capacitance may cause three problems: (1) the amount of charge stored in the cell capacitor may be decreased such that low-voltage operation characteristics are degraded; (2) the refresh cycle for supplying charge to the cell may need to be shortened to maintain information in the cell; and (3) soft error rate (SER) of the cell may be increased. Thus, it is generally desirable to increase the cell capacitance in order to improve power consumption and reliability of the device, the cell capacitance must be increased.

There are various techniques for increasing the cell capacitance. One conventional technique uses a material having a high dielectric constant, for example, $(Ba,Sr)TiO_3$ (BST) or a $Pb(Zr,Ti)O_3$ (PZT), as the dielectric film of a cell capacitor. However, when such a film is used, the selection of the material used for the electrode, in particular, the material used for the storage electrode of the capacitor, generally is important. One conventional technique uses a platinum (Pt) storage electrode having superior oxidation resistivity. Unfortunately, however, platinum (Pt) tends to readily react with a silicon substrate or a silicon film at a temperature of over 300° C., forming a platinum silicide film $(PtSi_x)$ which can increase the resistance of the storage electrode. Consequently, a barrier metal film typically is formed between the platinum film and the silicon substrate to prevent platinum atoms from being diffused into the silicon substrate.

A well-known technique for forming a barrier metal film utilizes a reactive sputtering process employing a titanium target or a tantalum target under an argon and nitrogen atmosphere. However, the barrier metal film formed by the sputtering process typically exhibits inferior step coverage and generally takes on a polycrystalline state. Consequently, when a metal wiring pattern is formed on the barrier metal film and undergoes subsequent heat treatment, metal atoms may be easily diffused through a grain boundary of the barrier metal film and into underlying structures. When a silicon substrate underlies the barrier metal film, metal atoms in the metal wiring pattern and silicon atoms in the silicon substrate may diffuse through a grain boundary of the barrier metal film and react, thereby forming a metal silicide and increasing the resistivity of the contact between the metal wiring pattern and the substrate.

An alternative technique for forming a barrier metal film involves forming a tantalum nitride film using penta dimethyl amido tantalum $Ta(N(CH_3)_2)_5$ as a metal source in order to form the barrier metal film in an amorphous state (see R. Fix et al., Chemical Material, 5, 614(1993)). According to this technique, the barrier metal film of $Ta_3N_5$ is formed using an ammonia ($NH_3$) gas as a reducing agent. However, as the resistivity of the tantalum nitride film ($Ta_3N_5$) formed at a temperature of 500° C. is typically around $1 \times 10^6$ $\mu\Omega$-cm, the tantalum nitride film ($Ta_3N_5$) so formed may not be suitable for use as a barrier metal film in a cell of a highly-integrated semiconductor device because of less than desirable conductivity, as illustrated in FIG. 2a. In addition, when the deposition temperature of the tantalum nitride film is 700° C. or higher, or the temperature in a subsequent heat treatment is 800° C. or higher, the tantalum nitride film ($Ta_3N_5$) may transform to a polycrystalline state (see FIGS. 3a, 5a and 5b). Thus, when a storage electrode of a capacitor is formed from a tantalum nitride film ($Ta_3N_5$), it may be undesirable to perform subsequent heat treatment at temperatures of 800° C. and higher.

SUMMARY OF THE INVENTION

In light of the foregoing, it is an object of the present invention to provide methods of fabricating a metal nitride layer which can remain in an amorphous state even after subsequent heat treatment.

It is another object of the present invention to provide methods of fabricating a metal nitride layer which can remain in an amorphous state at temperatures of 900° C. and greater.

It is yet another object of the present invention to provide a metal nitride layer which has a low resistivity suitable for use as a barrier layer in a highly integrated semiconductor device, and methods of fabrication therefor.

These and other objects, features and advantages are provided according to the present invention by forming a metal nitride layer on a substrate by exposing the substrate to a mixture including a nitrogen-containing organometallic gas, e.g., a penta dimethyl amido tantalum $(Ta(N(CH_3)_2)_5$ gas, and a hydrogen plasma, preferably at a temperature of 300° C. to 750° C. and a pressure of 0.5 torr to 1.5 torr. The hydrogen plasma may be formed in an atmosphere comprising hydrogen and an inert gas, e.g., argon. The plasma thus formed is preferably provided to a chamber in which the substrate is placed at a mass flow rate of 30 sccm to 100 sccm while the penta dimethyl amido tantalum ($Ta(N(CH_3)_2)_5$ gas is provided to the chamber at 50 sccm to 150 sccm. A tantalum nitride ($Ta_3N_5$) layer may thus be formed which has resistivity which is less than that of a conventionally formed tantalum nitride layer, and which retains an amorphous state after subsequent heat treatment.

In particular, according to the present invention, a metal nitride layer is formed on a substrate by exposing the substrate to a mixture including a nitrogen-containing organometallic gas and a hydrogen plasma to form a metal nitride layer on the substrate. The nitrogen-containing organometallic gas may include penta dimethyl amido tantalum $(Ta(N(CH_3)_2)_5$. The metal nitride layer may be formed by exposing the substrate to the mixture including penta dimethyl amido tantalum gas $(Ta(N(CH_3)_2)_5$ and hydrogen plasma at a temperature greater than 300° C., more preferably, at a temperature of 300° C. to 750° C. and a pressure of 0.5 torr to 1.5 torr. The penta dimethyl amido tantalum gas $(Ta(N(CH_3)_2)_5$ is preferably provided to a chamber in which the substrate is placed at a mass flow rate of 50 sccm to 150 sccm, and the hydrogen plasma is preferably provided to the chamber at a mass flow rate of 30 sccm to 100 sccm. The hydrogen plasma may be produced external to the chamber in an atmosphere comprising hydrogen and an inert gas such as argon. A tantalum nitride $(Ta_3N_5)$ layer having a resistivity less than 10 mΩ-cm may thereby be formed.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
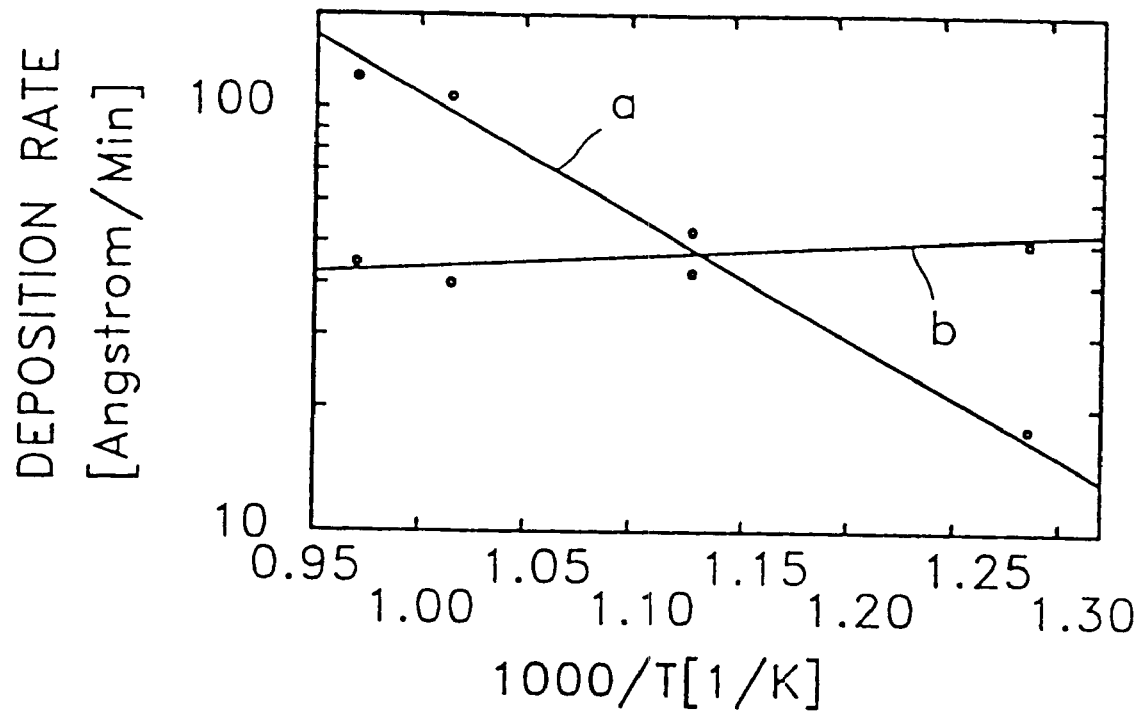
FIG. 1 is a graph illustrating relationships between deposition temperature and deposition rate for metal nitride layers formed according to conventional techniques and according to the present invention.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Figure 7:
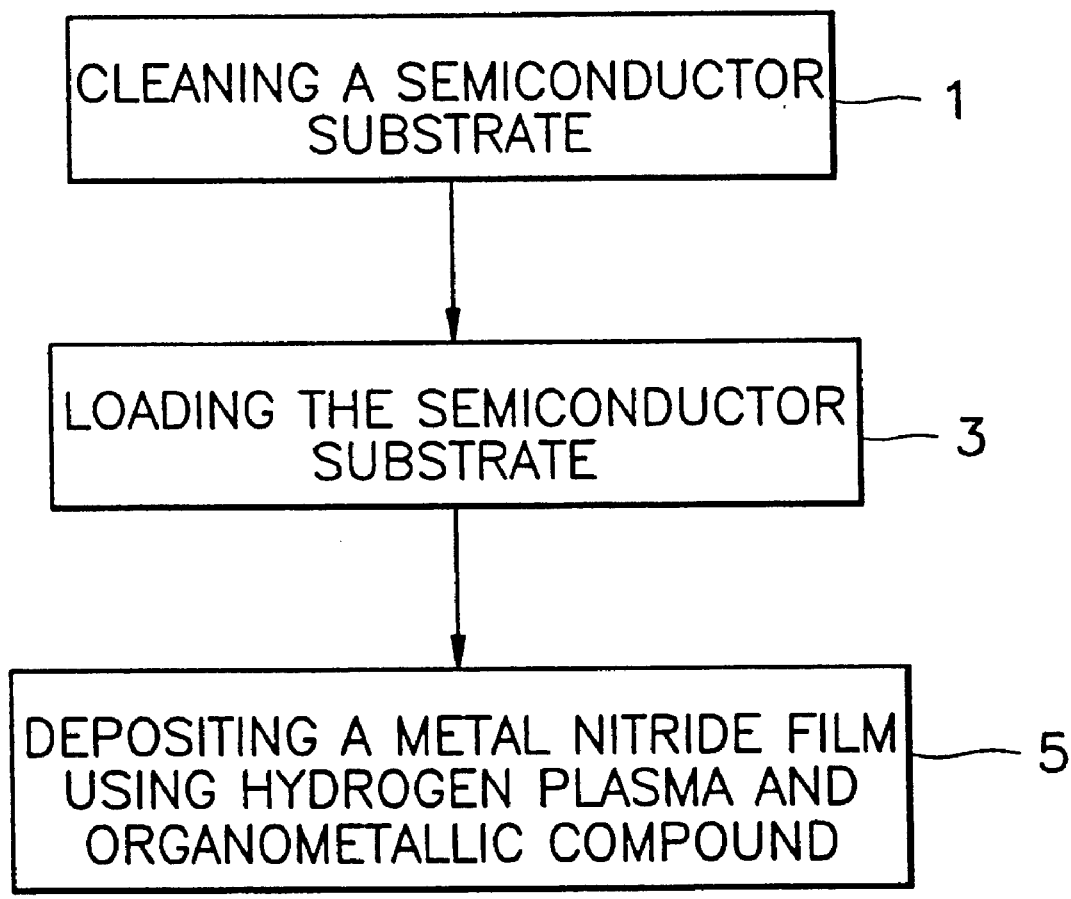
FIG. 7 is a flowchart illustration which illustrates operations for forming a metal nitride layer according to the present invention.

A method for forming a metal nitride layer will be described with reference to FIG. 7. A surface of a semiconductor, e.g., silicon, substrate is cleaned by first using a commonly-used cleaning solution such as an acetone solution or a methanol solution to remove contaminant materials, in particular, organic materials. Next, the substrate is dipped into a diluted hydrofluoric acid (HF) solution to remove a silicon dioxide layer which may be present on the substrate. The diluted HF solution remaining on the surface of the substrate may then be removed using deionized water. Thereafter, deionized water remaining on the the substrate may be removed using a spin/dry process, thereby completing the step of cleaning the substrate (Block 1).

The cleaned substrate then is then loaded into a deposition chamber (Block 3); where it is then heated, preferably to a temperature of around 200° C., to remove moisture. After moisture is removed, the substrate temperature is increased to between 700° C. to 800° C. and the internal pressure of the deposition chamber is adjusted to between 50 mTorr and 150 mTorr. Hydrogen plasma is then formed in the chamber in a manner well-known to those skilled in the art, thereby removing silicon dioxide which may be present on the surface of the substrate. The temperature of the substrate is then adjusted to between 300° C. and 750° C., the pressure inside the chamber is adjusted to between 0.5 Torr and 1.5 Torr, most preferably, 1 Torr, and a nitrogen-containing organometallic gas, e.g., a penta dimethyl amido tantalum $Ta(N(CH_3)_2)_5$ gas, and a hydrogen plasma are injected into the chamber. This exposes the substrate to a mixture including hydrogen plasma and a nitrogen-containing organometallic gas and forms a metal nitride layer, e.g., a tantalum nitride (TaN) layer, on the cleaned substrate (Block 5). The hydrogen plasma preferably is formed outside the chamber and injected into the chamber through a gas pipe or similar conduit connected thereto. To form a stable hydrogen plasma, argon gas can be mixed with the hydrogen gas, at an electric power input level of 100 watts to 500 watts, most preferably, 100 watts. It is preferable that the mass flow rate of the plasma formed from the mixed hydrogen and argon gases is between around 30 sccm (standard cubic centimeter per minute) and 100 sccm, and that the mass flow rate of the nitrogen-containing organometallic gas, e.g., the penta dimethyl amido tantalum $Ta(N(CH_3)_2)_5$ gas, is between 50 sccm and 150 sccm.

Various characteristics of metal nitride layers, e.g., a tantalum nitride layers, formed according to the present invention are shown in FIGS. 1 to 6, along with characteristics of tantalum nitride layers formed in a conventional manner using ammonia $(NH_3)$ as a reducing gas. FIG. 1 illustrates relationships between deposition rate and deposition (substrate) temperature for a conventional metal nitride layer (b) and a metal nitride layer (a) formed according to the present invention (in FIG. 1, the horizontal axis denotes deposition temperature in terms of reciprocals of absolute temperatures). As illustrated in FIG. 1, as deposition temperature varies from 500° C. to 750° C., the deposition rate of the conventional metal nitride layer changes within a small range between 35 Å/min and 55 Å/min, whereas formation rate of a metal nitride layer according to the present invention changes more dramatically within a range between 15 Å/min and 130 Å/min. Thus, when the metal nitride layer is deposited at a high temperature, e.g., 600° C. or more, the deposition rate according to the present invention generally is much more rapid than using conventional techniques, providing a potential improvement in productivity.

Figure 2A:
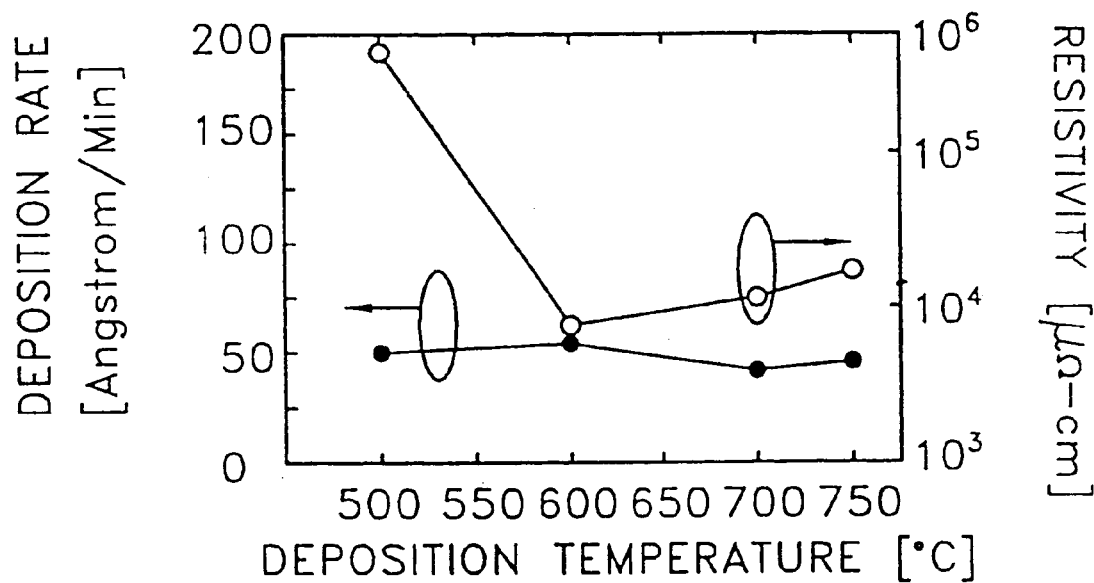
FIG. 2A is a graph illustrating relationships between deposition rate, resistivity and deposition temperature for conventionally-formed metal nitride layers.
Figure 2B:
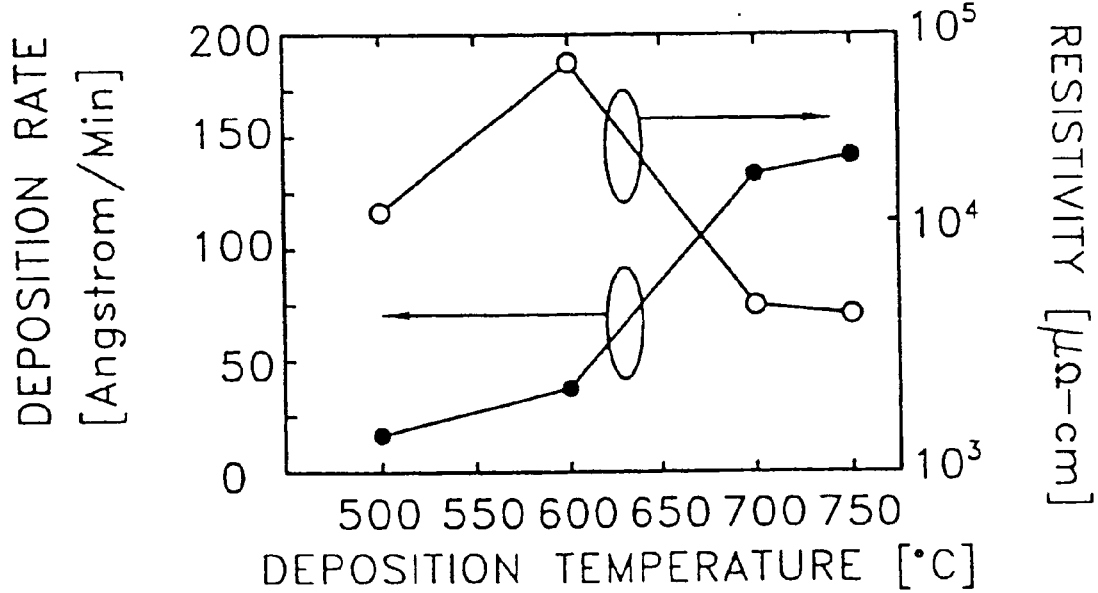
FIG. 2B is a graph illustrating relationships between deposition rate, resistivity and deposition temperature for metal nitride layers formed according to the present invention.

FIGS. 2A and 2B are graphs illustrating dependence of deposition rate (●) and resistivity (○) and deposition temperature for a metal nitride layer formed according to conventional techniques and a metal nitride layer formed according to the present invention, respectively. As illustrated in FIG. 2A, resistivity of a conventionally formed metal nitride layer shows a high value of $1 \times 10^6$ $\mu\Omega$-cm at a deposition temperature of 500° C. As the deposition temperature increases up to 750° C., resistivity decreases to a low value of $1 \times 10^4$ $\mu\Omega$-cm to $2 \times 10^4$ $\mu\Omega$-cm. In contrast, as illustrated in FIG. 2B, a metal nitride layer formed according to the present invention at a deposition temperature of between 700° C. and 750° C. may achieve a significantly lower resistivity of $4 \times 10^3$ $\mu\Omega$-cm to $5 \times 10^3$ $\mu\Omega$-cm.

Figure 3A:
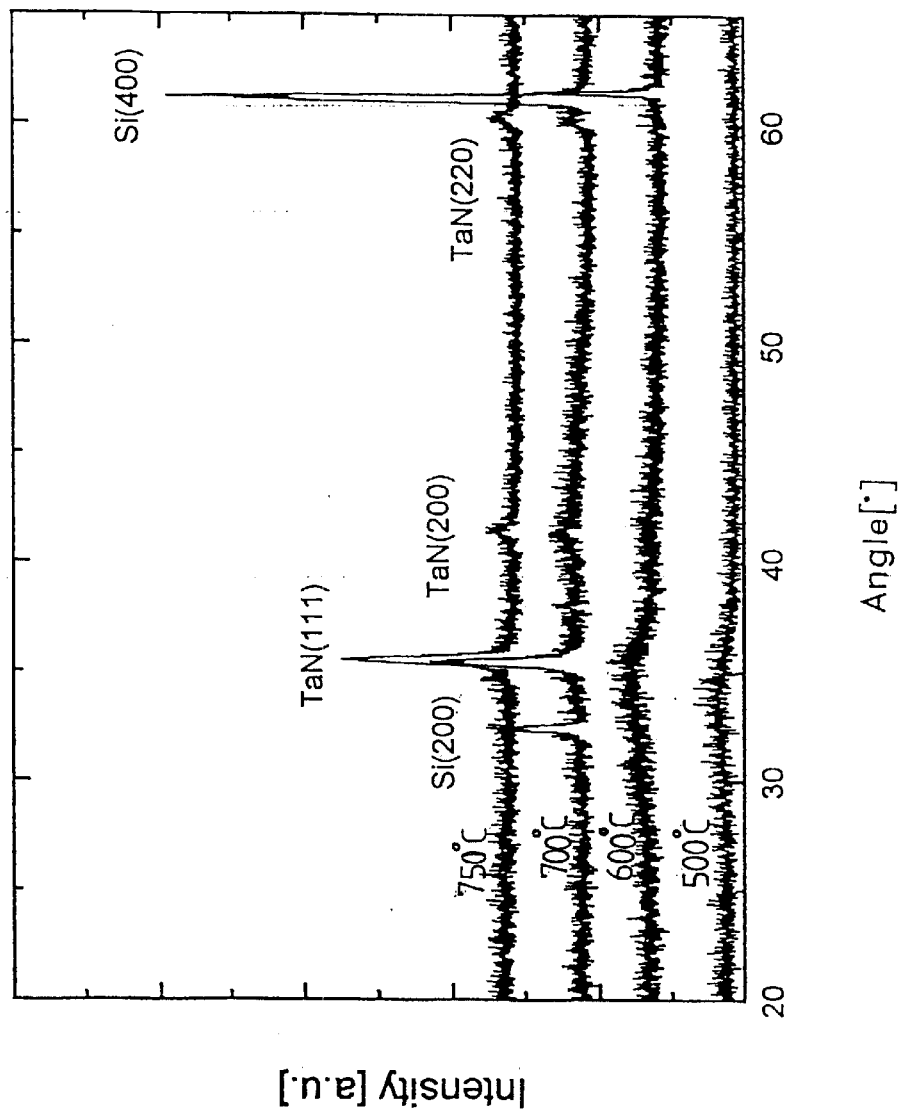
FIG. 3A illustrates X-ray diffraction patterns for conventionally-formed metal nitride layers formed at various deposition temperatures.
Figure 3B:
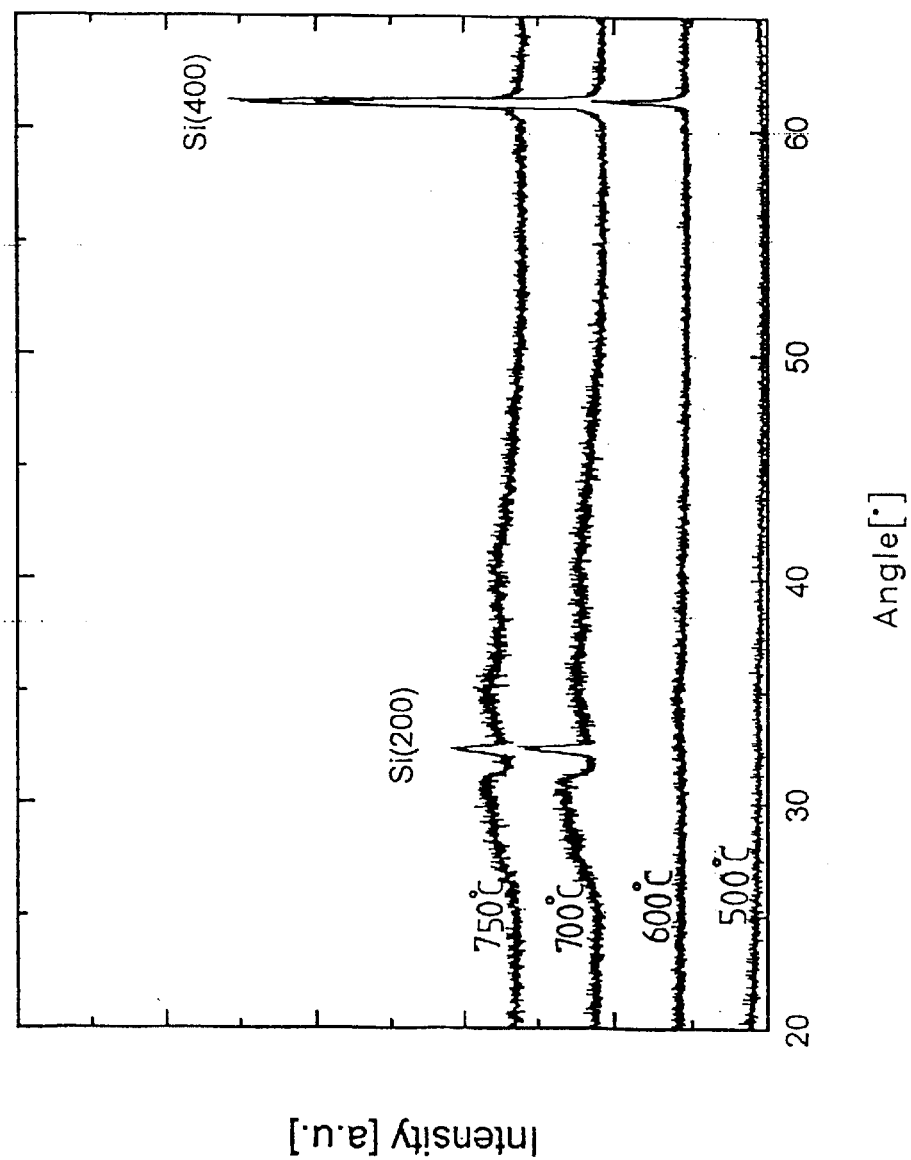
FIG. 3B illustrates X-ray diffraction patterns of metal nitride layers formed according to the present invention at various deposition temperatures.

FIG. 3A illustrates X-ray diffraction patterns for conventional tantalum nitride layers formed at various deposition temperatures, while FIG. 3B illustrates X-ray diffraction patterns for tantalum nitride layers formed according to the present invention for various deposition temperatures. As can be seen, the conventional tantalum nitride layer is crystallized in a (111) orientation at a deposition temperature of 700° C. or more, whereas the tantalum nitride layer formed according to the present invention exhibits little or no crystallization even when the deposition temperature increases up to 750° C.

Figure 4:
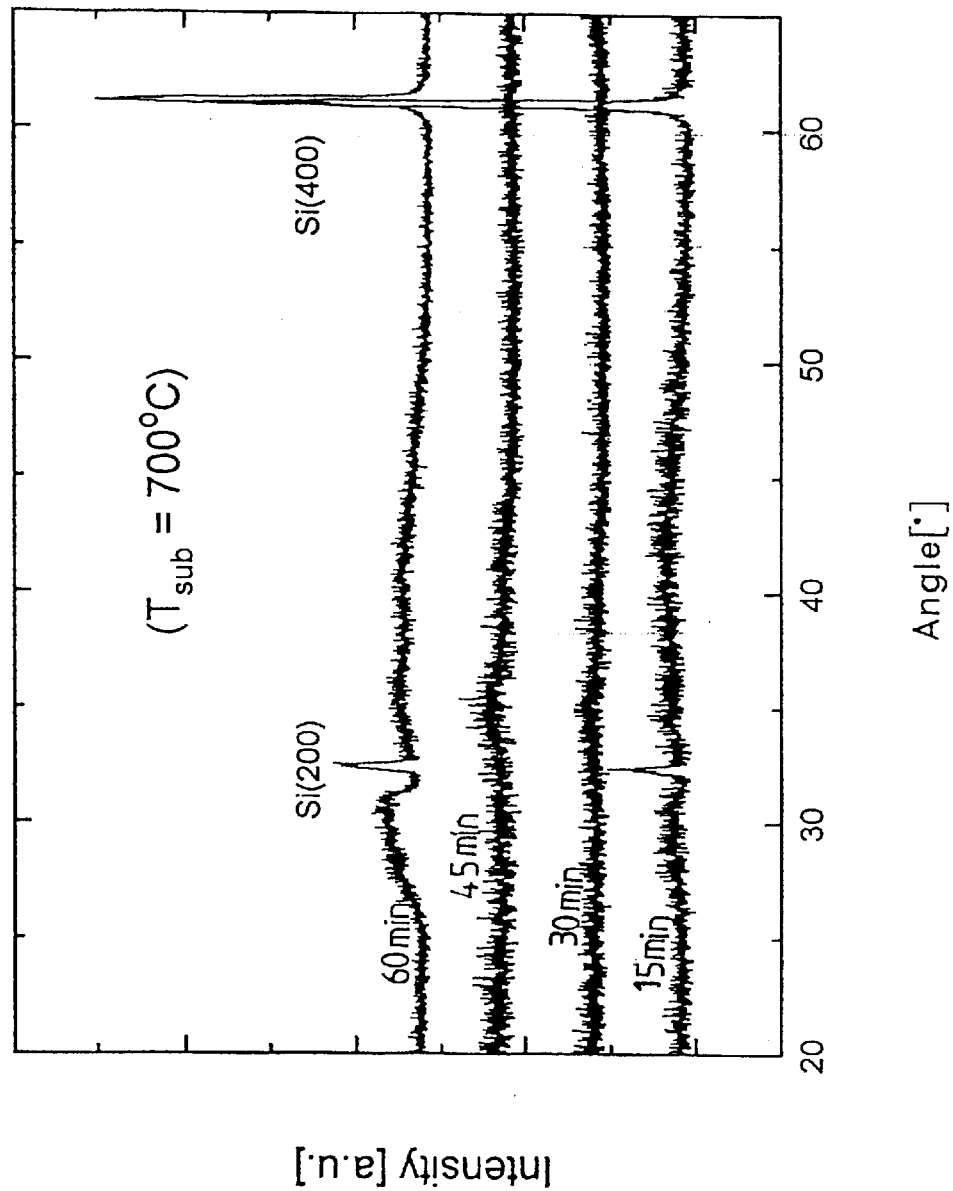
FIG. 4 illustrates X-ray diffraction patterns of the metal nitride layers formed according to the present invention formed over various deposition times.

FIG. 4 shows X-ray diffraction patterns for tantalum nitride layers formed according to the present invention at various deposition times and at a deposition temperature $T_{sub}$ of 700° C. As can be seen from FIG. 4, even as deposition time increases to 60 minutes, the tantalum nitride layer generally remains in an amorphous state.

Figure 5A:
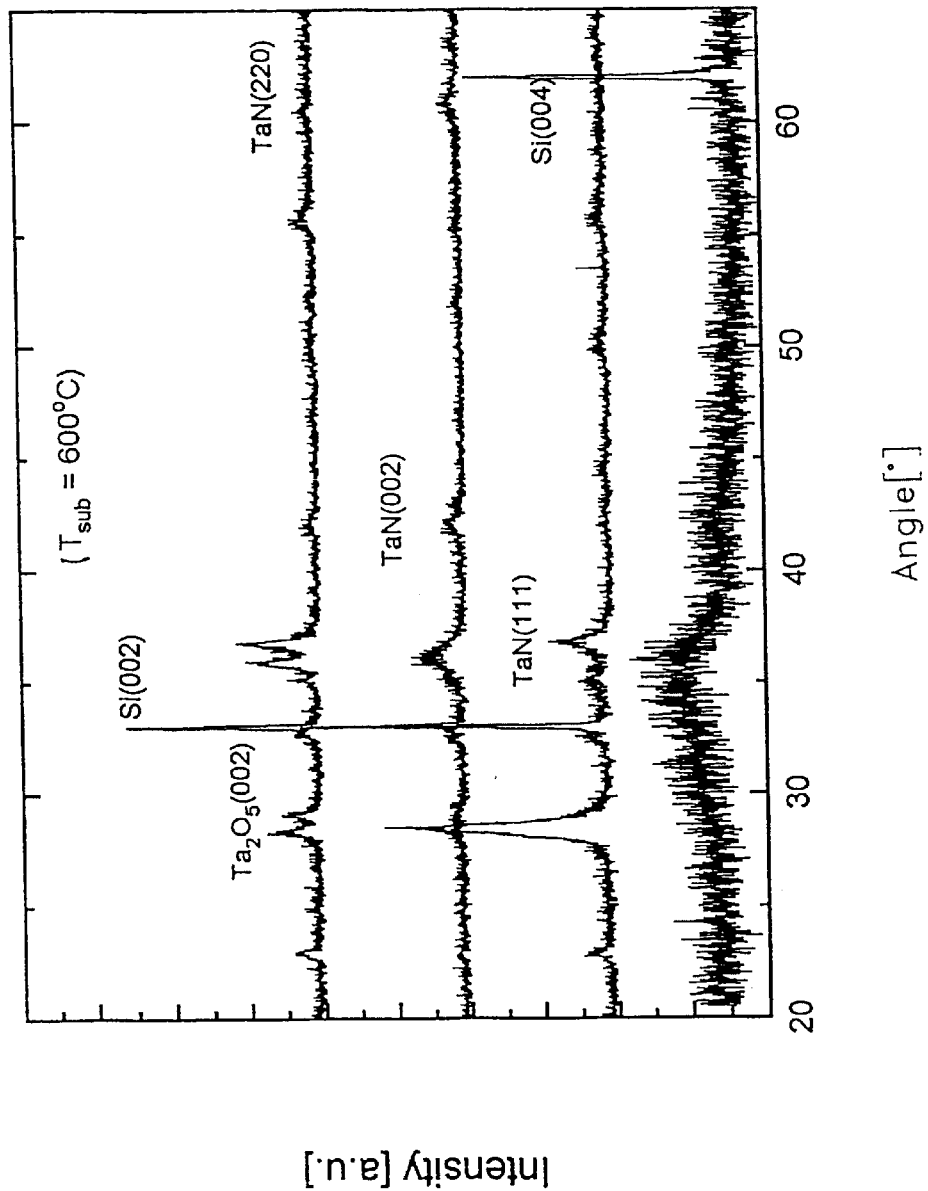
FIG. 5A illustrates X-ray diffraction patterns of conventionally-formed metal nitride layers formed at a deposition temperature of 600° C., after subsequent heat treatment at various temperatures.
Figure 5B:
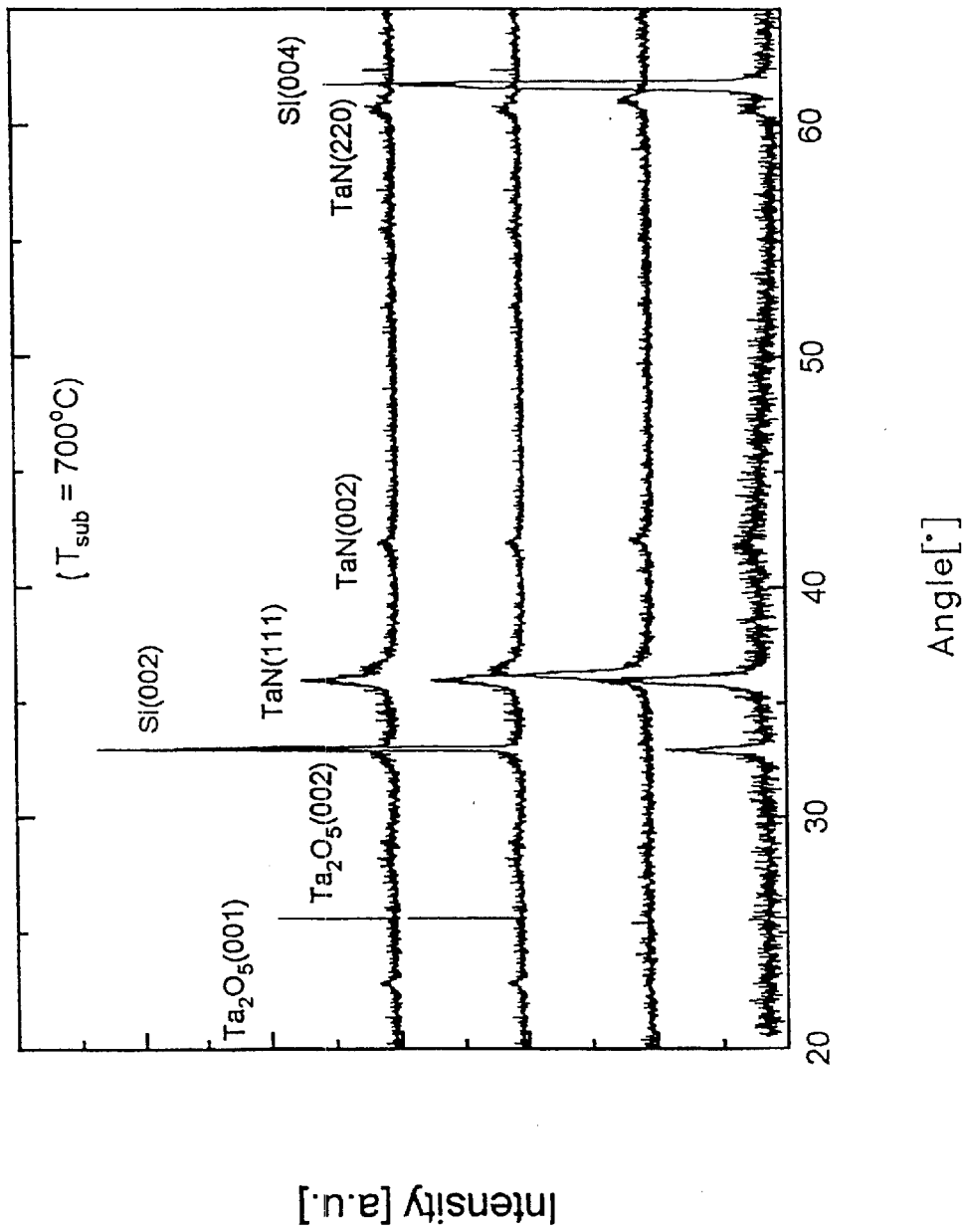
FIG. 5B illustrates X-ray diffraction patterns of conventionally-formed metal nitride layers formed at a deposition temperature of 700° C., after subsequent heat treatment at various temperatures.
Figure 6:
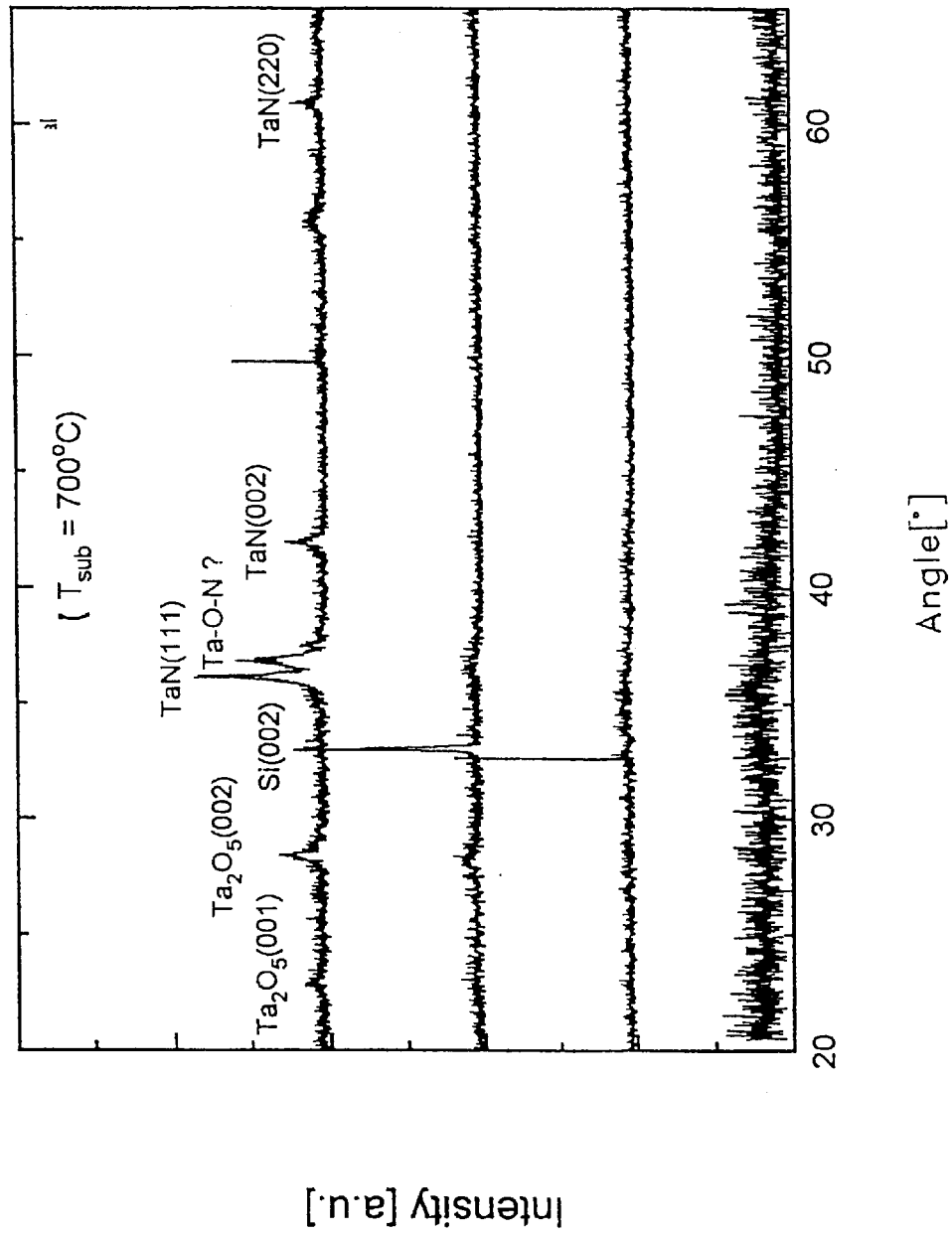
FIG. 6 illustrates X-ray diffraction patterns of metal nitride layers formed according to the present invention at a deposition temperature of 700° C., after subsequent heat treatment at various temperatures.

FIGS. 5A and 5B show X-ray diffraction patterns of conventional tantalum nitride layer formed at deposition temperatures $T_{sub}$ of 600° C. and 700° C., respectively, on which subsequent heat treatment is performed at various temperatures. FIG. 6 illustrates an X-ray diffraction pattern for a tantalum nitride layer formed according to the present invention at a deposition temperature $T_{sub}$ of 700° C., on which a subsequent heat treatment is performed at a temperature $T_h$ of 900° C. for 30 minutes under a nitrogen atmosphere, as well as a diffraction pattern N for a tantalum nitride layer formed according to the present invention at a deposition temperature $T_{sub}$ of 700° C. upon which no heat treatment has been applied. As can be seen in FIG. 5A, a conventional tantalum nitride layer deposited at a temperature of 600° C. has a (111) crystalline orientation produced by the subsequent heat treatment at a temperature $T_h$ of 800° C. As can be seen in FIG. 5B, a conventional tantalum nitride layer deposited at a temperature of 700° C. has a diffraction pattern N exhibiting a (111) crystalline orientation, even without subsequent heat treatment. In contrast, as shown in FIG. 6, even if heat treatment is performed at 900° C. on a tantalum nitride layer formed according to the present invention, a similar crystalline structure may not be formed.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a tantalum nitride layer on a substrate, said method comprising the step of:

exposing the substrate to a mixture including a nitrogen-containing organometallic gas and a hydrogen plasma to between 300° C. and 750° C. and between 0.5 torr and 1.5 torr to form a tantalum ($Ta_3N_5$) nitride layer on the substrate, the tantalum nitride layer being present in an amorphous state and having a resistivity of less than $1 \times 10^4$ $\mu\Omega$-cm.

2. A method according to claim 1, wherein the nitrogen-containing organometallic gas comprises penta dimethyl amido tantalum $(Ta(N(CH_3)_2)_5$.

3. A method according to claim 1, wherein said step of exposing is preceded by the steps of:

placing the substrate in a chamber;

providing penta dimethyl amido tantalum gas $(Ta(N(CH_3)_2)_5$ to the chamber at a mass flow rate of 50 sccm to 150 sccm; and providing a hydrogen plasma to the chamber at a mass flow rate of 30 sccm to 100 sccm.

4. A method according to claim 3, wherein said step of providing hydrogen plasma is preceded by the step of forming the hydrogen plasma in an atmosphere comprising hydrogen and an inert gas, external to the chamber.

5. A method according to claim 4, wherein the inert gas comprises argon.

6. A method according to claim 1, wherein said step of exposing is preceded by the step of forming the hydrogen plasma in an atmosphere comprising hydrogen and an inert gas.

7. A method according to claim 1, wherein said step of exposing comprises the step of exposing the substrate to a mixture including penta dimethyl amido tantalum $(Ta(N(CH_3)_2)_5$ and a hydrogen plasma to form a tantalum nitride $(Ta_3N_5)$ layer having a resistivity less than $5 \times 10^3$ $\mu\Omega$-cm.

8. A method according to claim 7, wherein said step of exposing comprises the step of exposing the substrate to a mixture including penta dimethyl amido tantalum $(Ta(N(CH_3)_2)_5$ and a hydrogen plasma to form a tantalum nitride $(Ta_3N_5)$ layer having a resistivity between $4 \times 10^3$ $\mu\Omega$-cm and $5 \times 10^3$ $\mu\Omega$-cm.

* * * * *